United States Patent
Lai et al.

(10) Patent No.: US 6,709,952 B2
(45) Date of Patent: Mar. 23, 2004

(54) METHOD OF FORMING A BOTTOM OXIDE LAYER IN A TRENCH

(75) Inventors: Shih-Chi Lai, Hsinchu (TW); Yi-Fu Chung, Hsinchu (TW); Jen-Chieh Chang, Hsinchu (TW); Ching-Chiu Chu, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/453,771

(22) Filed: Jun. 2, 2003

(65) Prior Publication Data

US 2004/0005766 A1 Jan. 8, 2004

(30) Foreign Application Priority Data

Jul. 2, 2002 (TW) .................................. 91114639 A

(51) Int. Cl.⁷ .................. H01L 21/76; H01L 21/302; H01L 21/461
(52) U.S. Cl. .................. 438/424; 438/435; 438/756; 438/757
(58) Field of Search ................ 438/424, 435, 438/437, 700, 756, 757

(56) References Cited

U.S. PATENT DOCUMENTS

| | | | |
|---|---|---|---|
| 4,847,214 A | * | 7/1989 | Robb et al. .................. 438/430 |
| 5,096,849 A | * | 3/1992 | Beilstein et al. ............ 438/424 |
| 5,940,717 A | * | 8/1999 | Rengarajan et al. ........ 438/435 |
| 6,479,368 B1 | * | 11/2002 | Mandelman et al. ....... 438/435 |
| 6,596,607 B2 | * | 7/2003 | Ahn ........................... 438/424 |

* cited by examiner

Primary Examiner—John Niebling
Assistant Examiner—Ron Pompey
(74) Attorney, Agent, or Firm—Townsend and Townsend and Crew LLP

(57) ABSTRACT

Embodiments of the present invention are directed to a method of forming a bottom oxide layer in a trench on a semiconductor substrate. In one embodiment, a method for forming a bottom oxide layer in a trench on a semiconductor substrate comprises depositing an oxide layer along the surface of the sidewall and the bottom of a trench on a semiconductor substrate which has top layers, depositing a nitride layer along the surface of the said oxide layer, and forming a photo-resist filler in a trench. The top surface of the photo-resist filler is lower than the top surface of the substrate to expose a portion of the nitride layer uncovered by the photo-resist filler. The exposed portion of the nitride layer is removed to expose the oxide layer underneath. A portion of the oxide layer on the sidewalls of a trench is removed to form a bottom oxide layer in a trench.

22 Claims, 3 Drawing Sheets

METHOD OF FORMING A BOTTOM OXIDE LAYER IN A TRENCH

CROSS-REFERENCES TO RELATED APPLICATIONS

This application claims priority from R.O.C. Patent Application No. 091114639, filed Jul. 2, 2002, the entire disclosure of which is incorporated herein by reference.

BACKGROUND OF THE INVENTION

The present invention relates to a process of forming a bottom oxide layer in a trench on a semiconductor substrate, and more specifically, to a method of forming the bottom oxide layer by introducing a silicon nitride layer and applying the isotropic etching process.

With the advance of integrated circuit technology into the ultra large scale integrated circuit (ULSI), the sizes of various devices have become increasingly small in order to manufacture the devices and the integrated circuits with high integration. However, when the scales of devices are getting smaller, it is difficult to fabricate these fine devices by applying the prior semiconductor processes. More critical and complicated processes are required to fabricate these fine devices to maintain higher yields and throughputs. Moreover, when the dimensions of integrated circuits are getting smaller, the device may not be able to meet the requirements of customers because the operating voltage, current, and the tolerant resistance thereof are also reduced. For solving these issues, power IC devices are widely applied and developed. In a typical power IC device, the gate structure is directly manufactured in the trench of the substrate, and the drain and source structures are also defined in the trench. And before fabricating the power IC device on the substrate, a bottom oxide layer is first formed on the bottom of the trench to be an insulating member. Then the subsequent processes are performed to define the gate, drain, and source structures in the trench.

In prior art, the high density plasma (HDP) deposition process is applied to form a bottom oxide layer in a trench. FIG. 1 illustrates the condition of applying the HDP process to deposit an oxide layer 12 on a substrate 10. In the depositing process, the portion of oxide layer deposited above a trench is bombarded by high density plasma and has some small pieces fall down in the trench 14, so the portion of oxide layer formed on the bottom of the trench 14 has a large thickness. In general, when the thickness of the oxide layer formed on the sidewall of the trench is about 500 angstroms, the thickness of the bottom oxide layer will reach about 3000 angstroms. Therefore, in the subsequent wet etching process, when the oxide layer on the sidewalls is removed completely, there remains still enough thickness of the oxide layer on the bottom of the trench to serve as a bottom oxide layer.

The HDP process can be applied to form a bottom oxide layer in a trench effectively as above, but in some semiconductor fabrication industries other methods are frequently used instead of the HDP process for forming the bottom oxide layers because HDP equipments are very expensive. Especially for semiconductor foundries, it is possible to manufacture all kinds of devices such as DRAM, Flash memory, and the like, according to the requirement and designation of customers. Therefore, it may not be economically feasible for the foundries to buy HDP deposition equipments just for manufacturing power IC devices.

Some methods have been introduced to form a bottom oxide layer in a trench without HDP deposition equipments. As seen in FIG. 2, after defining a trench on the substrate 20, an oxide layer 22 is deposited on the substrate 20, and deposited on bottoms and sidewalls of the trench. Then, a photo-resist layer is formed on the oxide layer 22 and fills the trench. An ashing process is performed to remove a portion of the photo-resist to form a photo-resist filler 24 in the trench.

As shown in FIG. 3, a portion of the oxide layer 22 is then removed by applying an etching solution. In the wet etching process, the etching solution eats away the oxide layer 22 on the sidewall along the interstices between the photo-resist filler 24 and sidewall of the trench to form the bottom oxide layer 26 on the bottom of the trench. However, because the adhesion property of the photo-resist on the oxide layer is not good, some seams will occur due to film peeling. Thus, the etchant will permeate into the bottom of the trench to erode the oxide layer 22 therein. As shown in FIG. 3, after the wet etching process, the remaining bottom oxide layer 28 has a gap defect and is disabled from effective insulating in many cases.

BRIEF SUMMARY OF THE INVENTION

Embodiments of the present invention are directed to a method of forming a bottom oxide layer in a trench on a semiconductor substrate. A nitride layer is used to promote adhesion property of the photo-resist formed on the nitride layer to prevent seams from forming therebetween and to keep the bottom oxide layer from erosion.

In accordance with an aspect of the present invention, a method for forming a bottom oxide layer in a trench on a substrate comprises depositing an oxide layer along the surface of sidewall and the bottom of a trench on a semiconductor substrate which has top layers, depositing a nitride layer along surface of the oxide layer, and forming a photo-resist filler in the trench. The top surface of the photo-resist filler is lower than the top surface of the substrate to expose a portion of the nitride layer uncovered by the photo-resist filler. The exposed portion of the nitride layer is removed to expose the oxide layer underneath. A portion of the oxide layer on the sidewall of the trench is removed to form a bottom oxide layer in the trench.

In some embodiments, the oxide layer comprises a TEOS material. A nitride layer has a thickness of about 100 to 500 angstroms, and about 200 angstroms in a specific example. The exposed portion of the nitride layer is removed by performing the isotropic etching process. The portion of the oxide layer on the sidewall of the trench is removed by the etching process. The etching process to remove the portion of the oxide layer may be performed with a buffer oxide etching (BOE) solution.

In accordance with another aspect of the invention, a method for forming a bottom oxide layer in a trench on a semiconductor substrate comprises etching a semiconductor substrate to form a trench thereon, performing the low pressure chemical vapor deposition to form an oxide layer on a semiconductor substrate and on the sidewall and bottom of a trench, depositing a nitride layer along the surface of the oxide layer, and forming a photo-resist filler in a trench. A portion of the nitride layer on the sidewall of a trench is not covered a photo-resist layer and is exposed. The exposed potion of the nitride layer is removed for exposing the oxide layer underneath. The oxide layer on a semiconductor substrate and on the sidewall of a trench is removed to have a remaining portion of the oxide film covered by the photo-resist filler on the bottom of a trench. The method further comprises removing the photo-resist filler, and removing the nitride layer to expose the remaining portion of the oxide layer in the trench.

In accordance with another aspect of the present invention, a method of forming a bottom oxide layer in a trench on a semiconductor substrate comprises depositing a nitride layer and an oxide layer on a semiconductor substrate in sequence, defining a trench pattern in the oxide layer and the nitride layer to expose a portion of the surface of the substrate, etching the exposed substrate to form a trench therein by applying the oxide layer and the nitride layer to serve as etching masks, forming a TEOS material layer on the oxide layer and the surface of sidewall and the bottom of a trench, forming a nitride layer on the TEOS material layer, coating a photo-resist layer on the substrate to fill the trench, performing an exposing process to cure the lower portion of the photo-resist layer in a trench, removing the upper portion of the photo-resist layer to form a photo-resist filler in a trench for exposing a portion of the second nitride layer on the top surface of the semiconductor substrate and on the sidewall of a trench, removing the exposed portion of the second nitride layer for exposing the TEOS material layer underneath, and removing the TEOS material layer on the oxide layer and the sidewall of a trench. A portion of the TEOS material layer remains on the bottom of a trench. The method further comprises removing the photo-resist filler, and removing second the nitride layer to expose the remaining portion of the TEOS material layer in a trench.

DETAILED DESCRIPTION OF THE INVENTION

The present invention discloses a method for forming a bottom oxide layer in a trench on a semiconductor substrate. A nitride layer is introduced between a photo-resist and an oxide material (e.g., TEOS) for promoting the adhesion property thereof to prevent seams from occurring due to film peeling. Thus, an oxide layer such as a TEOS layer on the bottom of a trench will not be eroded in the etching process. The detailed description about the present invention is as follows.

Figure 1:
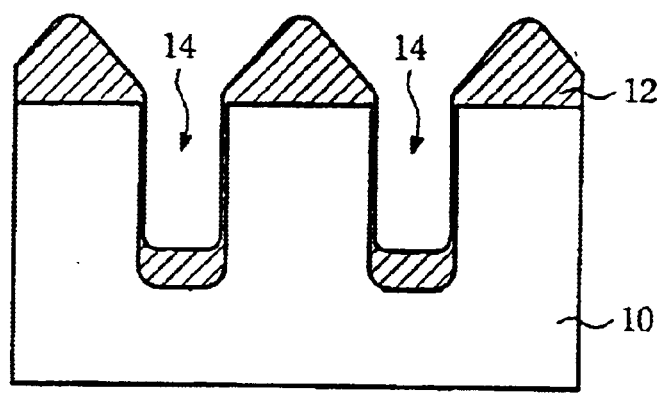
FIG. 1 is a cross-sectional view of a semiconductor substrate illustrating the steps of forming a bottom oxide layer in a trench by applying the high density plasma deposition process.
Figure 2:
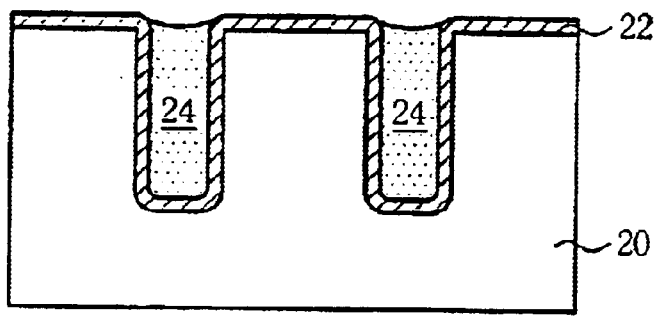
FIG. 2 is a cross-sectional view of a semiconductor substrate illustrating the steps of forming an uniform oxide layer on the surface of a trench and filling photo-resist into a trench according to the prior art.
Figure 3:
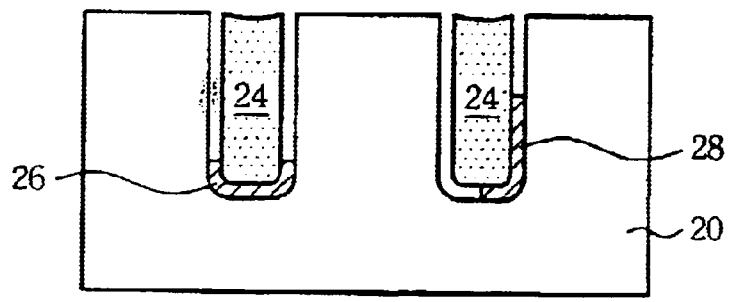
FIG. 3 is a cross-sectional view of a semiconductor substrate illustrating defects such as voids and gaps occurring in a bottom oxide after performing the wet etching process according to the prior art.
Figure 4:
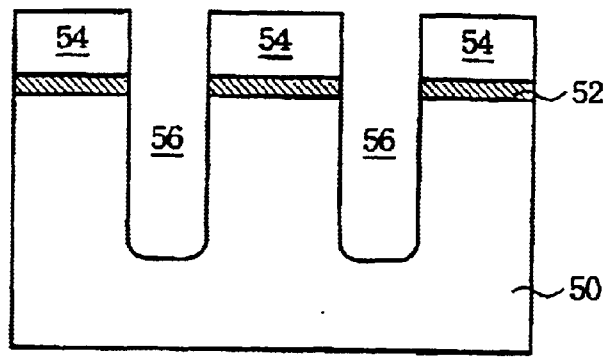
FIG. 4 is a cross-sectional view of a semiconductor substrate illustrating the steps of defining a trench on a semiconductor substrate according to an embodiment of the present invention.

In an exemplary embodiment, as shown in FIG. 4, a silicon substrate 50 is provided with <100> crystallographic orientation. In general, various semiconductor materials, such as gallium arsenide, germanium or silicon on insulator (SOI) can be chosen to serve as the substrate 50. It is understood that other suitable orientations such as <110> or <111> may be used since the surface property is not critical in the present invention.

Next, a nitride layer 52 and an oxide layer 54 are deposited in sequence on the silicon substrate 50. As well known, the nitride layer 52 and the oxide layer 54 can be formed by applying the chemical vapor deposition (CVD) process. Then a series of exposing and etching processes is performed to define a trench pattern in the oxide layer 54 and the nitride layer 52 and to expose a partial silicon substrate 50. Subsequently, the oxide layer 54 and the nitride layer 52 are applied to serve as etching masks for performing the etching process to define the trench 56 in the silicon substrate 50.

Figure 5:
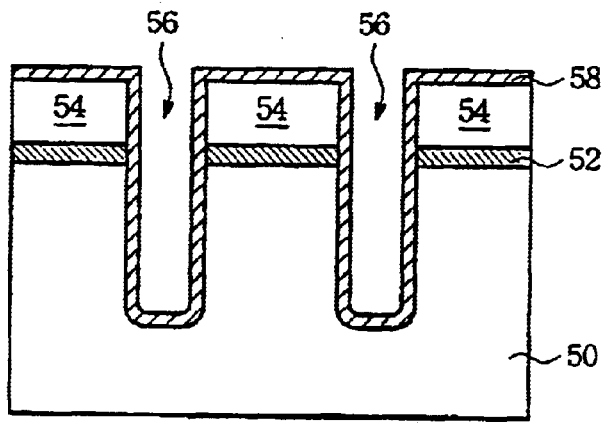
FIG. 5 is a cross-sectional view of a semiconductor substrate illustrating the steps of forming a TEOS material layer on the surface of a trench by applying the LPCVD process according to an embodiment of the present invention.
Figure 6:
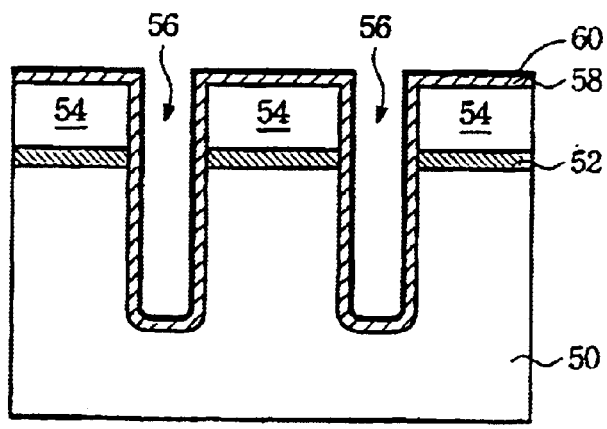
FIG. 6 is a cross-sectional view of a semiconductor substrate illustrating the steps of depositing nitride layer along the surface of a TEOS layer according to an embodiment of the present invention.

Referring to FIG. 5, the CVD process is applied to form an oxide film 58 on the silicon substrate 50. In a specific embodiment, the oxide film 58 can be formed by using the low pressure chemical vapor deposition (LPCVD) process and using TEOS material as a source. In other word, the oxide film 58 is a LP-TEOS oxide layer and deposited along the outer surface of the oxide layer 54, the nitride layer 52, the sidewall and bottom of the trench 56: As seen in FIG. 6, a second nitride layer 60 is formed on the oxide film 58, desirably with an uniform thickness of about 100 to 500 angstroms. In one preferred embodiment, the thickness of the nitride layer 60 is controlled to be about 200 angstroms.

Figure 7:
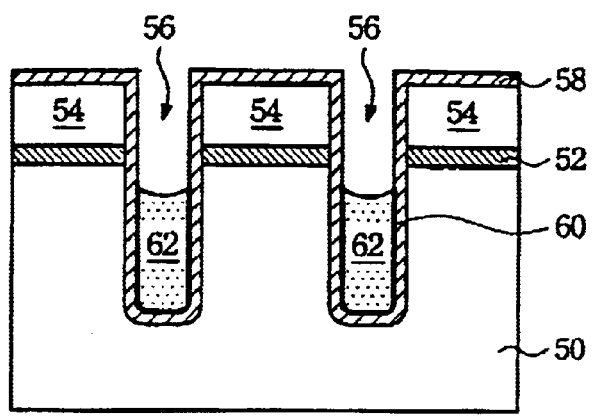
FIG. 7 is a cross-sectional view of a semiconductor substrate illustrating the steps of filling photo-resist into a trench to cover a portion of the nitride layer according to an embodiment of the present invention.

Next, photo-resist fillers 62 are formed in the trench 56, wherein the top surface of the photo-resist fillers 62 are lower than the top surface of the silicon substrate 50 to cover some part of nitride layer 60 formed on the lower sidewall and bottom of the trench 56. Notably, the portion of the nitride layer 60 formed on the upper sidewall of the trench 56 covered by the photo-resist fillers 62 are exposed. Generally, in the process of manufacturing the photo-resist fillers 62, a photo-resist is first coated on the silicon substrate 50 and fills the trench 56. Then, an exposing process is performed to cure the lower portion of the photo-resist in the trench 56. The etching process is then carried out to remove the upper portion of the photo-resist (namely to remove the uncured portion thereof) on the silicon substrate 50 and to form the photo-resist fillers 62 in the trench 56. Subsequently, another isotropic etching process is performed to remove the exposed portion of the nitride layer 60 and to expose a portion of the oxide layer 58 on the upper sidewall of the trench 56, as illustrated in FIG. 7.

Figure 8:
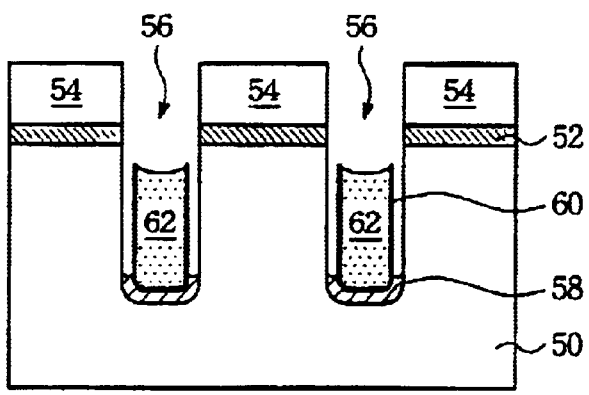
FIG. 8 is a cross-sectional view of a semiconductor substrate illustrating the steps of forming a bottom oxide layer in a trench by applying the wet etching process according to an embodiment of the present invention.
Figure 9:
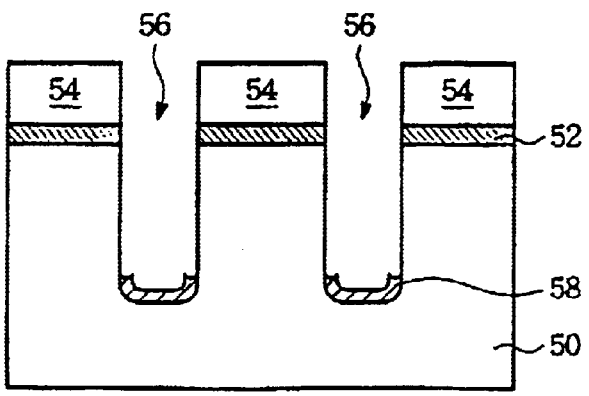
FIG. 9 is a cross-sectional view of a semiconductor substrate illustrating the steps of removing the photo-resist and the remaining nitride layer to expose a bottom oxide layer in a trench according to an embodiment of the present invention.

As shown in FIG. 8, the wet etching process is performed to remove the exposed portion of the oxide layer 58 on the surface of the oxide layer 54, the nitride layer 52, and the upper sidewall of the trench 56. In the wet etching process, the etchant will eat away the oxide layer 58 between the nitride layer 60 and sidewall of the trench 56. Thus, after performing the wet etching process, a portion of the oxide film 58 remain on the bottom of the trench 56. In a specific embodiment, the wet etching process is carried out by applying the buffer oxide etching (BOE) solution. Then, the photo-resist fillers 62 and the some remaining nitride layer 60 are removed completely to expose the remaining portion of the oxide layer 58, as shown in FIG. 9.

It is noted that the film peeling issue occurring between the photo-resist and the oxide layer in prior art can be prevented because the adhesion properties of the nitride layer adjacent to the photo-resist and the oxide layer are both good. So the probability of seams occurring between these layers can be decreased significantly. And it is effective to prevent the remaining portion of the oxide layer (e.g., TEOS layer) on the bottom of the trench from erosion be eroded in the BOE etching procedure.

The above-described arrangements of apparatus and methods are merely illustrative of applications of the principles of the present invention and many other embodiments and modifications may be made without departing from the spirit and scope of the invention defined in the claims. The scope of the present invention should not, therefore, be determined with reference to the above description, but instead should be determined with reference to the appended claims along with their full scope of equivalents.

What is claimed is:

1. A method for forming a bottom oxide layer in a trench on a semiconductor substrate, said method comprising:

depositing an oxide layer along the surface of the sidewall and the bottom of a trench on a semiconductor substrate which has top layers;

depositing a nitride layer along surfaces of said oxide layer;

forming a photo-resist filler in said trench, wherein the top surface of said photo-resist filler is lower than the top surface of said semiconductor substrate to expose a portion of said nitride layer uncovered by said photo-resist filler;

removing said exposed portion of said nitride layer to expose said oxide layer underneath; and removing a portion of said oxide layer on said sidewall of said trench to form a bottom oxide layer in said trench.

2. The method of claim 1, wherein said oxide layer comprises a TEOS material.

3. The method of claim 1, wherein said oxide layer is deposited by performing a low pressure CVD (LPCVD) process.

4. The method of claim 1, wherein said nitride layer has a thickness of about 100 to 500 angstroms.

5. The method of claim 1, wherein said nitride layer has a thickness of about 200 angstroms.

6. The method of claim 1, wherein the exposed portion of said nitride layer is removed by performing the isotropic etching process.

7. The method of claim 1, wherein said portion of said oxide layer on said sidewall of said trench is removed by the etching process.

8. The method of claim 7, wherein said etching process to remove said portion of said oxide film layer is performed with a buffer oxide etching (BOE) solution.

9. A method for forming a bottom oxide layer on a semiconductor substrate, said method comprising:

etching said semiconductor substrate to form a trench thereon;

performing a low pressure chemical vapor deposition to form an oxide layer on said semiconductor substrate and on the sidewall and the bottom of said trench;

depositing a nitride layer along the surface of said oxide layer;

forming a photo-resist filler in said trench, wherein a portion of said nitride layer on the sidewall of said trench is not covered by said photo-resist layer and is exposed;

removing said exposed potion of said nitride layer for exposing said oxide layer underneath;

removing said oxide layer on said semiconductor substrate and on said sidewall of said trench to have a remaining portion of said oxide layer covered by said photo-resist filler on the bottom of said trench;

removing said photo-resist filler; and removing said nitride layer to expose said remaining portion of said oxide layer in said trench.

10. The method of claim 9, wherein said oxide layer comprises a TEOS material.

11. The method of claim 9, wherein said nitride liner has a thickness of about 100 to 500 angstroms.

12. The method of claim 9, wherein said nitride layer has a thickness of about 200 angstroms.

13. The method of claim 9, wherein said exposed portion of said nitride layer is removed by performing the isotropic etching process.

14. The method of claim 9, wherein said oxide layer on said semiconductor substrate and on said sidewall of said trench is removed by the wet etching process.

15. The method of claim 14, wherein said wet etching process of removing said oxide film is performed with a buffer oxide etching (BOE) solution.

16. A method of forming a bottom oxide layer in a trench on a semiconductor substrate, said method comprising:

depositing a nitride layer and an oxide layer on said substrate in sequence;

defining a trench pattern in said oxide layer and said nitride layer to expose a portion of the surface of said substrate;

etching said substrate to form a trench therein by applying said oxide layer and said nitride layer to serve as etching masks;

forming a TEOS material layer on said oxide layer and the surface of sidewall and the bottom of said trench;

forming a second nitride layer on said TEOS material layer;

coating a photo-resist layer on said substrate to fill said trench;

performing the exposing process to cure the lower portion of said photo-resist layer in said trench;

removing the upper portion of said photo-resist layer to form a photo-resist filler in said trench for exposing a portion of the second said nitride layer on said semiconductor substrate and on the sidewall of said trench;

removing said exposed portion of said second nitride layer for exposing said TEOS material layer underneath;

removing said TEOS material layer on said oxide layer and said sidewalls of said trench, wherein a portion of said TEOS material layer remains on the bottom of said trench;

removing said photo-resist filler; and removing said second nitride layer to expose said remaining portion of said TEOS material layer in said trench.

17. The method of claim 16, wherein said TEOS material layer is deposited by applying a low pressure chemical vapor deposition process.

18. The method of claim 16, wherein said second nitride layer has a thickness of 100 to 500 angstroms.

19. The method of claim 16, wherein said second nitride layer has a thickness of 200 angstroms.

20. The method of claim 16, wherein the said exposed portion of said second nitride layer is removed by performing the isotropic etching process.

21. The method of claim 16, wherein said portion of said TEOS material layer on said oxide layer and said sidewall of said trench is removed by the wet etching process.

22. The method of claim 21, wherein said wet etching process is performed with a buffer oxide etching (BOE) solution.

* * * * *